United States Patent
Lang et al.

(10) Patent No.: US 7,420,148 B2
(45) Date of Patent: Sep. 2, 2008

(54) METHOD AND DEVICE FOR DETERMINING A PIXEL GRAY SCALE VALUE IMAGE

(75) Inventors: Christian Lang, Laufen (DE); Bernd Schneider, Baltmannsweiler (DE); Holger Jordan, Ingolstadt (DE); Armin Dobusch, Ingolstadt (DE)

(73) Assignee: Conti Temic microelectronic GmbH, Nurenberg (DE)

( * ) Notice: Subject to any disclaimer, the term of this patent is extended or adjusted under 35 U.S.C. 154(b) by 736 days.

(21) Appl. No.: 11/082,248

(22) Filed: Mar. 14, 2005

(65) Prior Publication Data

US 2005/0190206 A1  Sep. 1, 2005

Related U.S. Application Data

(63) Continuation-in-part of application No. PCT/DE03/02966, filed on Sep. 6, 2003.

(30) Foreign Application Priority Data

Sep. 13, 2002 (DE) ................................ 102 42 693

(51) Int. Cl.
*H01L 27/00* (2006.01)
*H01L 27/146* (2006.01)
(52) U.S. Cl. ............. 250/208.1; 250/214.1; 250/214 R
(58) Field of Classification Search ............. 250/208.1, 250/214, 338.4, 338.1, 370.01, 214 R, 372, 250/214.1
See application file for complete search history.

(56) References Cited

U.S. PATENT DOCUMENTS

| 6,777,659 B1 | 8/2004 | Schwarte |
| 7,361,883 B2 * | 4/2008 | Xu et al. ................ 250/214.1 |
| 2002/0084430 A1 | 7/2002 | Bamji et al. |

FOREIGN PATENT DOCUMENTS

| DE | 44 39 298 | 6/1996 |
| DE | 198 21 974 | 11/1999 |

* cited by examiner

*Primary Examiner*—Georgia Y. Epps
*Assistant Examiner*—Tony Ko
(74) *Attorney, Agent, or Firm*—W. F. Fasse; W. G. Fasse

(57) ABSTRACT

Disclosed is a method for determining a pixel gray scale value image, particularly for a multi-dimensional image system. According to said method a first modulation signal (M1) which is emitted at the emitting end and is reflected on an object that is to be recorded is correlated with a second modulation signal (M2) and is recorded at the receiving end based on at least two correlation signals (Ua, Ub or Ia, Ib) that are proportional to the respective received first modulation signal (M1). One of said modulation signals (M1, M2) is phase shifted in several phase steps ($\psi k$) at the emitting or receiving end and a differential signal (D) is determined for each phase step ($\psi k$) based on the correlation signals (Ua, Ub or Ia, Ib,) and a pixel gray scale value ($P_{Gray}$) is determined based on said difference signal (D) independently of interfering signals.

10 Claims, 7 Drawing Sheets

State of the Art

State of the Art

METHOD AND DEVICE FOR DETERMINING A PIXEL GRAY SCALE VALUE IMAGE

CROSS-REFERENCE TO RELATED APPLICATION

This application is a Continuation In Part under 35 U.S.C. §111, 120 and §365 of PCT International Application PCT/DE2003/002966, filed on Sep. 6, 2003, which designated the United States, and which was published in a language other than English. The entire disclosure of the PCT International Application is incorporated herein by reference.

PRIORITY CLAIM

Through the above identified PCT International Application, this application claims the priority under 35 U.S.C. §119 of German Patent Application 102 42 693.7, filed on Sep. 13, 2002. The entire disclosure of the German Priority Application is incorporated herein by reference.

The invention relates to a method and device for determining a pixel gray scale value image, particularly for a multi-dimensional image system, e.g. for 3D-camera systems, which are based on the so-called photonic mixer detector principle (in short called PMD-principle) or PMD-like principles, which use depending on the type for example light waves, microwaves or sound waves as signal waves.

The functional principle of a conventional photonic mixer detector (also called Photonic Mixer Device) is known in many cases and is described in detail for example in DE 198 21 974 A1.

In a possible field of application with the photonic mixer detectors a method analyzing differential signals for example in case of distance measurements is used according to the phase correlation method, wherein the efficiency of the photonic mixer detector is limited by interfering signal portions of the signals entering the subtraction. For calculating the distance value in particular the difference of the signal currents or signal voltages, resp., in the two halves of a pixel element of the photonic mixer detector (also called in short PMD-Pixel) is significant.

Therefore, efforts are made to perform subtraction directly on the chip or semi-conductor (="On chip"), to improve accuracy of the distance values. For example, long lines may cause parasitic inductions. For minimizing or at best eliminating these parasitic inductions, the individual signals are processed directly on chip, e.g. by means of an amplifier. By the low dimensions of the circuitry on a chip interferences are distributed symmetrically on the detector units and thus are eliminated during subtraction. For obtaining a conventional pixel gray scale value image, for instance with the photogate PMD, the signal lines for Ua and Ub have to be provided in addition to the differential signal.

Apart from the calculation of the distance value based on illumination also a pixel gray scale value image representing the object may be determined. For determining a pixel gray scale value image it is usual to add the signals of the detector or readout units of the pixel halves. This leads to the fact that a number of signal lines corresponding to the number of signals is to be provided and separately processed. Consequently, also the number of outputs of the PMD-chip increases and thus also the number of the analogue signals, which have to be converted into digital signals for processing. Beyond this, with a simultaneous representation of the distance and pixel gray scale value the image repeat rate (also called frame rate) is reduced based on the required numerous conversions, particularly signal conversions. Furthermore, the external circuit is particularly complex due to the use of several outputs.

A further disadvantage with the pixel gray scale valuing by summing the individual signals occurs, if a circuit suppressing or compensating the constant light or interfering light is switched active. When increasing the wanted signal at first also the pixel gray scale value portion increases, but falls after having reached a predetermined and preset threshold for the constant light suppression, until a constant value has been achieved so that the pixel gray scale value is falsified. The pixel gray scale value continues to be falsified, as soon as it has exceeded the predetermined and preset threshold for the constant light suppression.

It is, therefore, the object of the invention to indicate a method for determining a pixel gray scale value image, particularly for a multi-dimensional image system, which enables a particularly safe, fast and accurate detection of the pixel gray scale value for each individual pixel. Furthermore, a particularly simple device for determining a pixel gray scale value image is to be indicated.

The object relating to the method is attained in accordance with the invention by the features of independent claim 1. The object relating to the device is attained in accordance with the inventions by the features of independent claim 12.

Advantageous further embodiments of the invention are part of the subclaims.

With the method according to the invention for each image pixel a first modulation signal, emitted at the emitting end and reflected on an object that is to be recorded is correlated with a second modulation signal, e.g. an electrical signal, and is recorded by at least two correlation signals that are proportional to the respective received first modulation signal, wherein at least one of the modulation signals is phase-shifted in several phase steps at the emitting end or receiving end, and wherein for each phase step based on the correlation signals a differential signal is determined and on its basis a pixel gray scale value is determined independently of interfering signals. This means that several detector or receiving units, e.g. modulation gates or antennas, are actuated with a first modulation signal, e.g. a modulated light wave or micro wave signal, wherein a phase modulation is performed in several phase steps at the emitting end or receiving end and a representing differential signal is determined at the receiving end for the respective phase step based on loads, e.g. photo loads, produced at the receiving units proportional to the first modulation signal, based on which differential signal the pixel gray scale value is determined independently, particularly free of interfering signals. In other words: By means of the produced differential signals in the individual phase steps a pixel gray scale value or pixel distance value is produced, independently and free of background light or stray light, resp., or interfering signals.

In a preferred example of embodiment based on the differential signals a pixel gray scale value as well as a pixel distance value is determined. In particular, the pixel gray scale value and the pixel distance value are determined simultaneously, i.e. parallel based on the differential signals. By means of this it is ensured that on the one hand the external circuit expenditure based on the use of a single output signal—namely the differential signal—is minimized. On the other hand the image repeat rate and the number of signal samplings can be reduced based on the simultaneous recording and release of gray scale and distance image, what accelerates a further processing, particularly an image processing.

In a particularly easy example of embodiment the pixel gray scale value is determined based on the complex function of the differential signal as per $$|z| = P_{Gray} = \sqrt{(\Delta Re)^2 + (\Delta Im)^2} \quad (1)$$

with $P_{Gray}$=pixel gray scale value, $\Delta Re$=real part of the differential signal, particularly a voltage differential signal, $\Delta Im$=imaginary part of the differential signal, particularly a voltage differential signal;

In other words: The amount of the complex signal value is produced from imaginary and real part, which represents a pixel gray scale value, independently and free of background light and interfering signals. The pixel gray scale value $P_{Gray}$ is the size of the receiving wanted signal.

For recording wavelength-dependant pixel gray scale value or intensity images the modulation signal is generated in different wavelengths, for example in the infrared range with 900 nm, ultraviolet range or in the visible range with 675 nm. By means of this a pixel gray scale value image is determined, which depends from the wavelength of the illumination unit. In other words: as the illuminated scenery has been recorded with a modulated emitter of a certain wavelength, the gray scale value image is wavelength selective.

For determining the pixel distance value and the pixel gray scale value on the basis of the so-called phase correlation method, one of the modulation signals is phase-shifted in the respective phase step by 45° or 90° at the receiving end or emitting end. Particularly, depending on the presetting—increase of accuracy or of promptness or of both—any equidistant distribution of the phase steps via a period of 2 n is particularly advantageous.

For further improving the representation of the pixel gray scale value image, e.g. in case of a poor image contrast, the pixel gray scale value may additionally be logarithmized. Alternatively or additionally, the pixel gray scale value can be increased based on a correction factor, e.g. by the factor two.

The conventional pixel gray scale value can also be determined dependent on only one correlation signal. Here, analogue to the pixel gray scale value according to the invention, one of the modulation signals is phase-shifted in several phase steps, particularly in four or eight phase steps. Subsequently, for enhancing the accuracy the mean value is preferably generated.

With regard to the device the object is attained in accordance to the invention in that an emitter for emitting a modulation signal and at least one reception unit for receiving the first modulation signal that is reflected on an object that is to be recorded, as well as a signal generator and a phase shifter for phase modulation at the emitting end or receiving end in phase steps are provided, wherein a related readout unit each is associated to the reception unit for determining at least two correlation signals each proportional to the received first modulation signal, which readout unit is connected with an analyzing unit for determining a differential signal produced by the correlation signals and for determining a pixel gray scale value independently and particularly free of interfering light based on the detected differential signal.

Depending on the type of method preferably modulation gates or antennas serve as receiving units. An optical source or μ-wave source serves as an emitter.

In the case of an optical image system the optical light source serves for actuating the modulation gate with an optical modulation signal. In this context, for a correlation of the first modulation signal with the second modulation signal, one of the modulation signals, e.g. the electrical or the optical signal, is phase-shifted at the emitting end or receiving end in several phase steps by means of a signal generator and a phase shifter. One readout unit each, e.g. a readout diode, is associated to the modulation gates for detecting the photo loads representing the modulation gates, which readout unit is connected to the analyzing unit for determining a differential signal created from the photo loads and for determining a pixel gray scale value independently of stray light portion and interfering signal by means of a detected differential signal.

The essential advantage of the invention is mainly that the external circuit expenditure can be minimized by the invention, as for analyzing the distance image and the pixel gray scale value image independently of stray light and interfering signal only the differential signal is required. Furthermore, the number of signal scanning for determining the pixel gray scale value is reduced. Consequently, the frame rate of a PMD-camera can be kept constant with a simultaneous representation of the distance image and the pixel gray scale value image independently of the background light. When simultaneously representing the pixel gray scale value image by summation of the signals of the pixel halves and the distance image the frame rate is reduced. Beyond this, with the method according to the invention it is ensured that the determination of the pixel gray scale values by a suppression circuit of external light is not falsified. With an active suppression circuit of stray light the signal dynamics of a PMD-camera with wanted light variation is increased by determining the pixel gray scale value and the pixel gray scale value image independently of stray light. Particularly, the method is suitable for recording wavelength-selective pixel gray scale value images and for calculating a pixel gray scale value independently and free of stray light for the construction of reemission measuring devices. By means of this a construction of reemission measuring devices based on PMD-technology is possible. Furthermore, the method can be used on PMD-similar principles.

Advantageous and further embodiments of the invention idea will become apparent from the further description taken in conjunction with the drawing.

Hereinafter the invention is further explained by the examples of embodiment taken in conjunction with the drawings.

Like reference numerals refer to like elements or elements with identical functions throughout all views, unless otherwise mentioned.

FIG. 1 shows a general block diagram for an device 1 for determining a pixel gray scale value image according to the quasi-heterodyne method.

Figure 1:
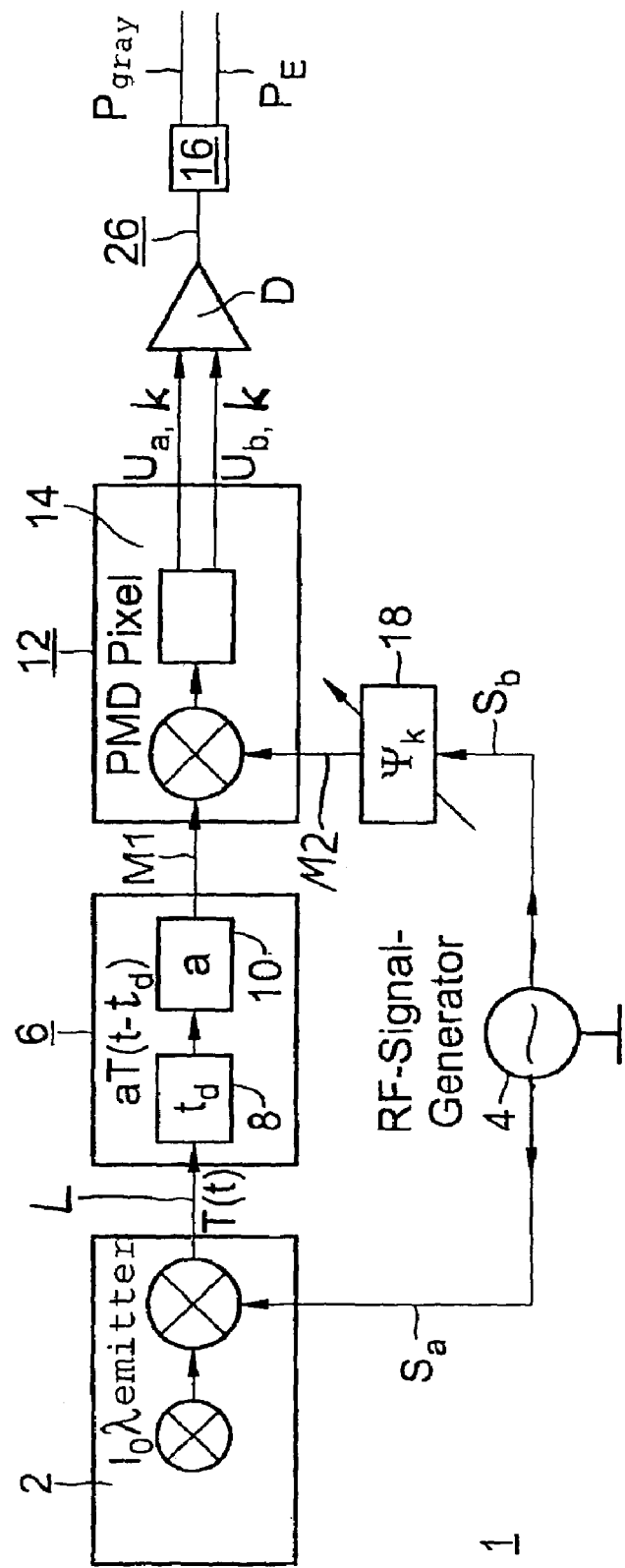
FIG. 1 shows a general block diagram for a device for determining a pixel gray scale value image in accordance with the quasi-heterodyne method.

The device 1 comprises as an emitter 2 for example for an optical image system a light source for producing an active illumination such as e.g. a light L, particularly infrared light, ultraviolet light or light in the visible range. On this occasion the light L coming from the light source or the emitter 2 is varied dependent on a predetermined first electrical modulation signal 5a in the amplitude. For this purpose the emitter 2 is connected with a signal generator 4. The first modulation signal M1 (=an optical signal, in the following called in short modulation signal M1) is emitted from the emitter 2 and is reflected on a transmission path 6 (=measured section) from an object or a scene to be recorded which is not further explained. Here, on the transmission path 6 it comes to a delay 8 and a damping 10 of the first modulation signal M1, which at the receiving end is correlated by a reception unit 12 with the electrical signal S produced by the signal generator 4 as a second modulation signal M2. A photonic mixer detector (hereinafter called photonic mixer detector 12) serves as a reception unit 12.

As an example a pixel element 14 (also called PMD-pixel) of the photonic mixer detector 12 is shown schematically in FIG. 1. For recording an image of the object or the scenery several pixel elements 14 not further described in mode and function are arranged in series or in columns or in a matrix as a photonic mixer detector 12 and form for instance a multi-dimensional optical system such as a 3D-camera.

In the respective pixel element 14 so-called photo-generated load carriers, in short called photo loads, are produced proportionally to the received optical modulation signal M1. On the basis of several received optical modulation signals M1 and the photo loads generated of them the distance of an object actuated with the optical modulation signal M1 within a phase range of $2\pi$ of a distance proportional phase shift $\phi$ between received and reference modulation signal can be determined by means of the so-called phase correlation method. For this purpose the electrical signal S both on the emitting end as a signal Sa and at the receiving end as a signal Sb is supplied for mixing with the light L and the modulation signal M1, resp., of the light source or the emitter 2 and the photonic mixer detector 12, resp. For determining the distance-proportional phase shift $\phi$ at least two correlation measurements are required. Then, by means of the unit D arranged downstream to the pixel element 14, a difference signal D is generated based on the photo loads and is provided to the evaluating unit 16 via the output line 26.

Beyond this, when operating the device 1 the illuminated scenery or the illuminated object can be recorded with a certain wave length by means of the modulated emitter 2—the modulated light source. This enables the wave-length selective detection of pixel gray scale value images. For this purpose for example the object or the scenery is illuminated with different wavelengths of the infrared range, visible range or ultraviolet range, e.g. with 900 nm, 675 nm or 350 nm.

If a scenery is irradiated from the emitter 2 embodied as a light source for an active illumination with a constant light power, the reemission of the scenery can be determined from the pixel gray scale value $P_{Gray}$ independently of the background light, and the distance value $P_E$. In this way the described method makes recording of the 2D-reemission images possible.

Depending on the type and embodiment of the device 1 further correlation measurements can be carried out, which are produced by means of one or several additional phase delay steps $\psi_k$ (hereinafter called phase steps $\psi_k$). For this purpose the device 1 comprises a phase shifter 18, which depending on its arrangement enables a phase shift at the emitting end or receiving end. As an example a phase shift at the receiving end is provided in FIG. 1, in which the phase shifter 18 is arranged between the signal generator 4 and the photonic mixer detector 12. Preferably, the received optical modulation signal M1 is shifted in the respective phase step $\psi_k$ by 45° or 90° or by a phase step $\psi_k$ lying within the phase range of $2\pi$.

Figure 2:
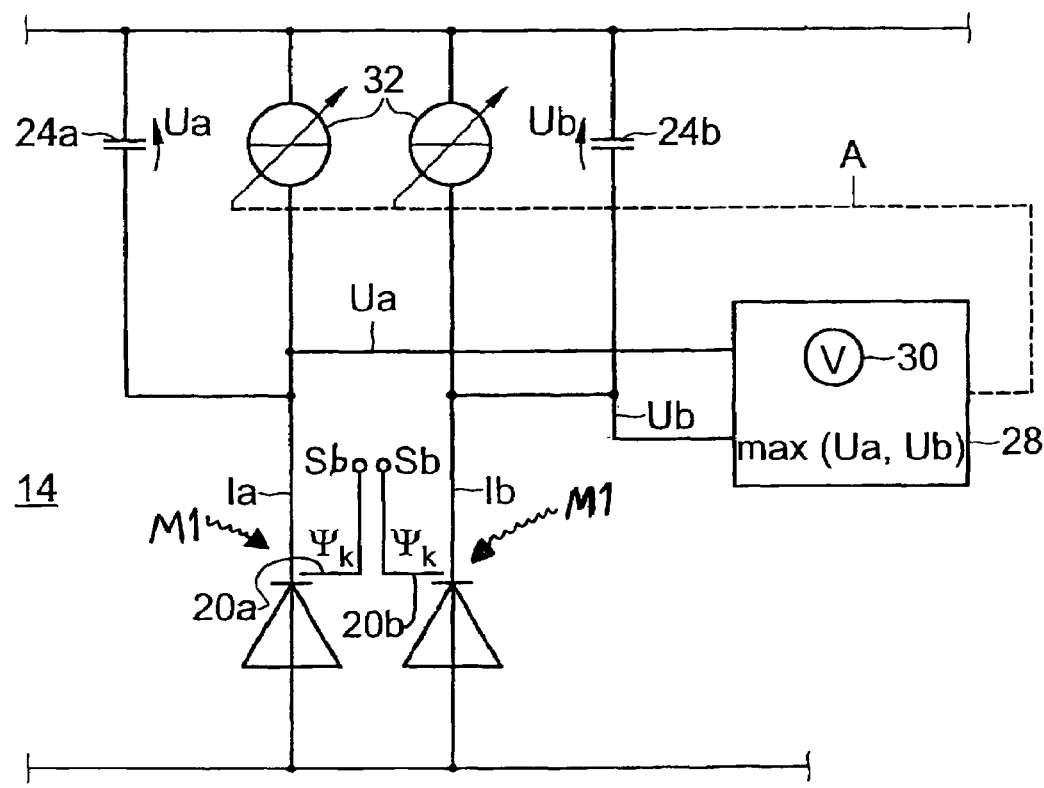
FIG. 2 shows a basic circuit diagram of a pixel element for a photonic mixer detector with a constant light suppression circuit.

In FIG. 2 a pixel element 14 of the photonic mixer detector 12 is shown in detail. In this case a pixel element 14 comprises as a reception unit 12 for instance two modulation gates 20a and 2b for receiving the optical modulation signal M1 and for generating the proportional photo loads. With an alternative application of the device 1 not shown in detail the reception unit 12 can be embodied as an antenna, the emitter 2 is embodied in this case as an HF-emitter.

For determining the photo loads readout units 22a and 22b are associated to the modulation gates 20a and 20b. Here, the readout units 22a and 22b serve for releasing current signals Ia and Ib (also called photo currents).

For a further processing, particularly for forming the difference of the current signals Ia and Ib or the voltage signals Ua and Ub, respectively, a corresponding difference-forming electronics D is provided after the readout electronics 34 and is connected with the evaluating unit 16 via the output line 26. Based on subtraction of the current signals Ia and Ib and the voltage signals Ua and Ub, respectively, a size forming the basis, e.g. a pixel distance value $P_E$ or a pixel gray scale value $P_{Gray}$, is determined by the evaluating unit 16. Depending on the type and embodiment also more than two modulation gates 20a and 20b and readout units 22a and 22b can be provided per pixel element.

In other words: By means of the differential signal D, particularly the current differential signal and voltage differential signal $\Delta U$, respectively, produced on the basis of the current signals Ia and Ib, and the voltage signals Ua and Ub, respectively, the pixel gray scale value $P_{Gray}$ is determined independently and free of interfering signals, in particular of stray light SL. In this connection by means of subtraction or difference formation D of the signals detected at the readout units 22a and 22b and the subsequent readout method by means of the evaluating unit 16, a compensation of the interfering signals and the independency of the pixel gray scale value $P_{Gray}$ from the stray light SL as well as the determination of the size of the wanted or useful signal is effected.

Alternatively or additionally for this purpose depending on type and embodiment of the device 1 a stray light suppression circuit 28 can be provided per pixel. In FIG. 2 only an example for a suppression circuit 28 is shown; also any other form with a similar effect can be used. If, for example, one of the two voltage values or voltage signals Ua, Ub, which changes more strongly with regard to time due to a higher current signal Ia and Ib, resp., exceeds a preset threshold value G, this voltage signal Ua and Ub, resp., pauses on an almost constant value, viewed over a longer period of time. Whereas the respective second voltage value Ua and Ub, resp., is again disintegrated after a signal integration phase. However, the voltage difference values $\Delta U$ remain unaffected by this. In this way the two voltage signals Ua and Ub are processed by means of a maximum value detector 30 of the stray light suppression circuit 28, so that at the output an output signal A, which is proportional to the higher of the two voltage signals Ua and Ub, resp., is applied for controlling two identical current sources 32.

In the following the method for determining the pixel gray scale value $P_{Gray}$ independently of the stray light or background light shall be described based on an 8-phase triggering of the photonic mixer detector 12. The method is not restricted to an 8-phase triggering, but can in general be used for any number N of phase algorithms or phase steps $\psi_k$.

The phase shifting or the phase offset $\phi_d$, is complexly derived in the preferred example embodiment. Subsequently, the pixel gray scale value $P_{Gray}$, independent or free of background light, is determined from the imaginary and real part.

The determination of the pixel distance value $P_E$ is performed based on a phase algorithm with the phase steps $\psi_k$ as per:

$$\Psi_k = \frac{2\pi}{N} \cdot k \quad (2)$$

with k=[0, 1, ..., N-1], N being the number of the phase steps $\psi_k$. In the example the number N equals 8 (=8 phase measurements). As an output signal the respective receiver unit 12 delivers for each phase measurement k two voltage signals Ua,k and Ub,k, which are supplied to the difference formation D. By means of the difference formation D, the total output signal or differential signal D, for example the voltage differential signal $\Delta U$ of these voltage signals Ua,k and Ub,k, is formed in vector form as follows:

$$Ua = [Ua, 0, Ua, 1, Ua, 2, Ua, 3, Ua, 4, Ua, 5, Ua, 6, Ua, 7] \quad (3)$$

$$Ub = [Ub, 0, Ub, 1, Ub, 2, Ub, 3, Ub, 4, Ub, 5, Ub, 6, Ub, 7] \quad (4)$$

$$\Delta U = [Ua - Ub] = [\Delta U0, \Delta U1, \Delta U2, \Delta U3, \Delta U4, \Delta U5, \Delta U6, \Delta U7] \quad (5)$$

The resulting phase offset $\phi_d$ arises from:

$$\varphi_d = \arctan\frac{\Delta \text{Im}}{\Delta \text{Re}} \quad (6)$$

With the aid of trigonometric forms the imaginary part $\Delta$Im and the real part $\Delta$Re can be determined. For instance, if at the emitting end the modulation of the illumination or light source, i.e. the emitter 2, is shifted by the phase step $\psi_k$ with $(t-\psi_k)$ in relation to the modulation of the photonic mixer detector 12, this results in the following trigonometric forms.

$$X_0 = \Delta U_0[\cos(0°) + j \cdot \sin(0°)] = \Delta U_0 \quad (7)$$

$$X_1 = \Delta U_1[\cos(45°) + j \cdot \sin(45°)] = \frac{\sqrt{2}}{2}\Delta U_1 + j \cdot \frac{\sqrt{2}}{2}\Delta U_1$$

$$X_2 = \Delta U_2[\cos(90°) + j \cdot \sin(90°)] = j \cdot \Delta U_2$$

$$X_3 = \Delta U_3[\cos(135°) + j \cdot \sin(135°)] = -\frac{\sqrt{2}}{2}\Delta U_3 + j \cdot \frac{\sqrt{2}}{2}\Delta U_3$$

$$X_4 = \Delta U_4[\cos(180°) + j \cdot \sin(180°)] = -\Delta U_4$$

-continued $$X_5 = \Delta U_5[\cos(225°) + j \cdot \sin(225°)] = -\frac{\sqrt{2}}{2}\Delta U_5 + j \cdot \left(-\frac{\sqrt{2}}{2}\right)\Delta U_5$$

$$X_6 = \Delta U_6[\cos(270°) + j \cdot \sin(270°)] = -j \cdot \Delta U_6$$

$$X_7 = \Delta U_7[\cos(315°) + j \cdot \sin(315°)] = \frac{\sqrt{2}}{2}\Delta U_7 + j \cdot \left(-\frac{\sqrt{2}}{2}\right)\Delta U_7$$

The imaginary part $\Delta$Im and the real part $\Delta$Re are determined as follows:

$$\Delta \text{Im} = \sqrt{2}\,(\Delta U_1 + \Delta U_3 - \Delta U_5 - \Delta U_7) + 2(\Delta U_2 - \Delta U_6) \quad (8)$$

$$\Delta \text{Re} = \sqrt{2}\,(\Delta U_1 - \Delta U_3 - \Delta U_5 - \Delta U_7) + 2(\Delta U_0 - \Delta U_4) \quad (9)$$

If one inserts the imaginary part $\Delta$Im and the real part $\Delta$Re into the equation (6), when considering the phase shifting at the emitting end by means of the respective phase step $\psi_k$ this results in the following equation:

$$\varphi_d = \arctan\left[(-1) \cdot \frac{\left[\sqrt{2}\,(\Delta U_1 + \Delta U_3 - \Delta U_5 - \Delta U_7) + 2(\Delta U_2 - \Delta U_6)\right]}{\left[\sqrt{2}\,(\Delta U_1 - \Delta U_3 - \Delta U_5 + \Delta U_7) + 2(\Delta U_0 - \Delta U_4)\right]}\right] \quad (10)$$

If, in contrast, a phase shifting with phase steps $\psi_k$ takes place at the receiving end for the photonic mixer detector 12, there is no negative sign in the equation (10), i.e. the sign is dependent from the direction of the phase shifting.

For calculating the pixel gray scale value image the ensuing embodiments are not necessary, however, are mentioned as a matter of completeness.

The distance value R can be calculated as follows:

$$R = \frac{\varphi_d \cdot c}{2\omega} \quad (11)$$

with $\phi_d = \omega \cdot \tau$ and $\tau = 2R/c$.

For a better understanding of the method according to the invention for determining the pixel gray scale value $P_{Gray}$ based on differential values D, in the following the method known in the state of art is described in short. In this context the pixel gray scale value $P_{Gray\ scale\ value}$ is determined by summation of the voltage signals Ua and Ub. Here, the device 1 for determining the pixel gray scale value image according to the state of art differs in the evaluation unit 16, the components at the emitting and the receiving end are identical. The pixel gray scale values $P_{Gray\ scale\ value}$, which are obtained from a pixel element 14, result in accordance with the state of art from the addition of the voltage values Ua and Ub.

$$P_{Gray\ scale\ value} = U_a + U_b \quad (12)$$

If in the state of art for example an 8-phase algorithm is used, the voltages [Ua,0, Ua,1, Ua,2, Ua,3, Ua,4, Ua,5, Ua,6, Ua,7] and [Ub,0, Ub,1, Ub,2, Ub,3, Ub,4, Ub,5, Ub,6, Ub,7] are added up for increasing the accuracy of the pixel gray scale value $P_{Grayscalevalue}$. Subsequently, averaging can take place. The averaged pixel gray scale value $P_{Grayscalevalue}$ is determined as per:

$$\sum a = \frac{U_{a,0} + U_{a,1} + U_{a,2} + U_{a,3} + U_{a,4} + U_{a,5} + U_{a,6} + U_{a,7}}{8} \quad (13)$$

$$\sum b = \frac{U_{b,0} + U_{b,1} + U_{b,2} + U_{b,3} + U_{b,4} + U_{b,5} + U_{b,6} + U_{b,7}}{8}$$

$$\overline{P_{Greyscalevalue}} = \sum a + \sum b$$

Figure 3:
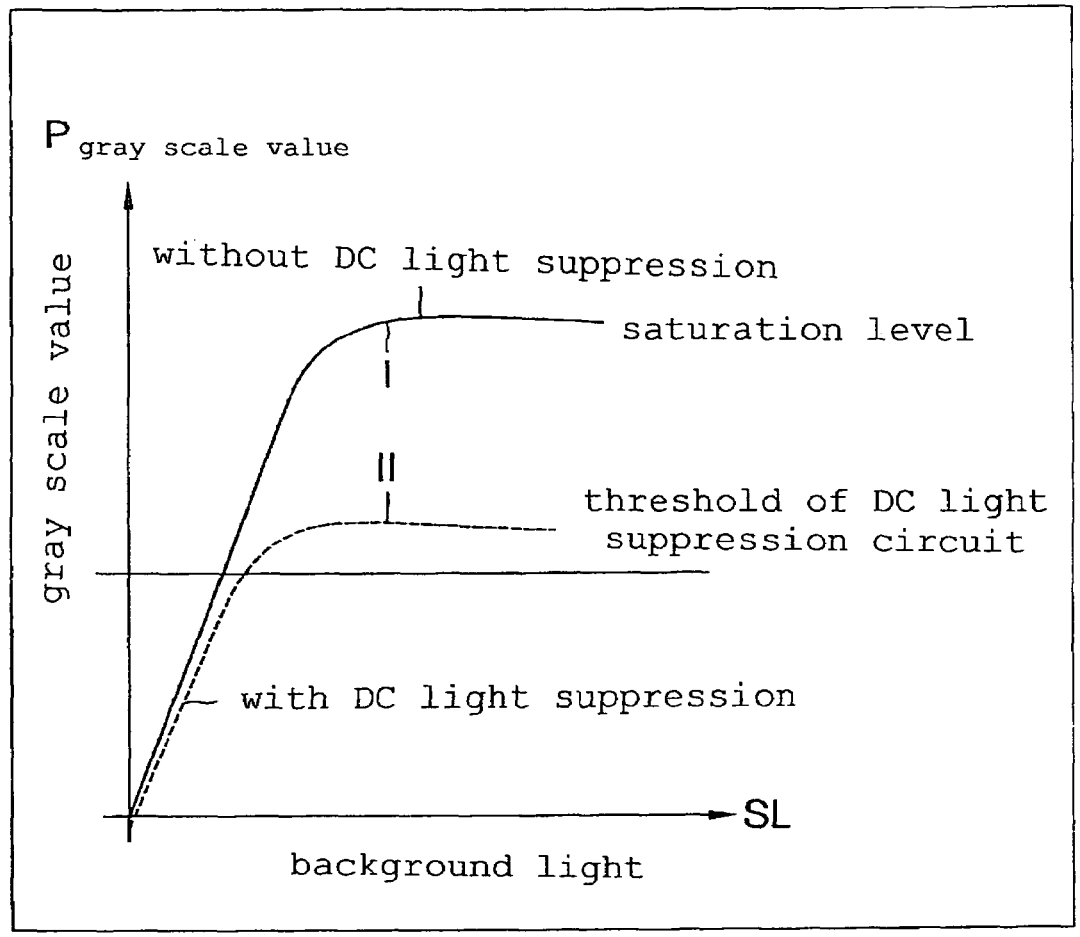
FIG. 3 shows in a schematic view the behavior of the pixel gray scale value by summation in case of an increase of the background light according to the state of art.

As an example FIG. 3 shows in a schematic view the behavior of the pixel gray scale value $P_{Grayscalevalue}$ for a pixel gray scale value image by summation subject to an increase of the interfering stray light or background light, according to the state of art. At first, the course of the pixel gray scale value $P_{Grayscalevalue}$ with deactivated stray light suppression circuit 28 is taken into consideration (see curve I, full line). If the interfering stray light SL or constant light is increased, also the pixel gray scale value $P_{Grayscalevalue}$ is increased until a saturation level has been reached. If one activates the stray light suppression circuit 28, the pixel gray scale value $P_{Grayscalevalue}$ equally increases with growing stray light SL, but only until the preset threshold of the stray light suppression circuit 28 (see curve II, dashed line). From this threshold the pixel gray scale value $P_{Grayscalevalue}$ also reaches a saturation level by summation, as is made clear by FIG. 3.

Figure 4:
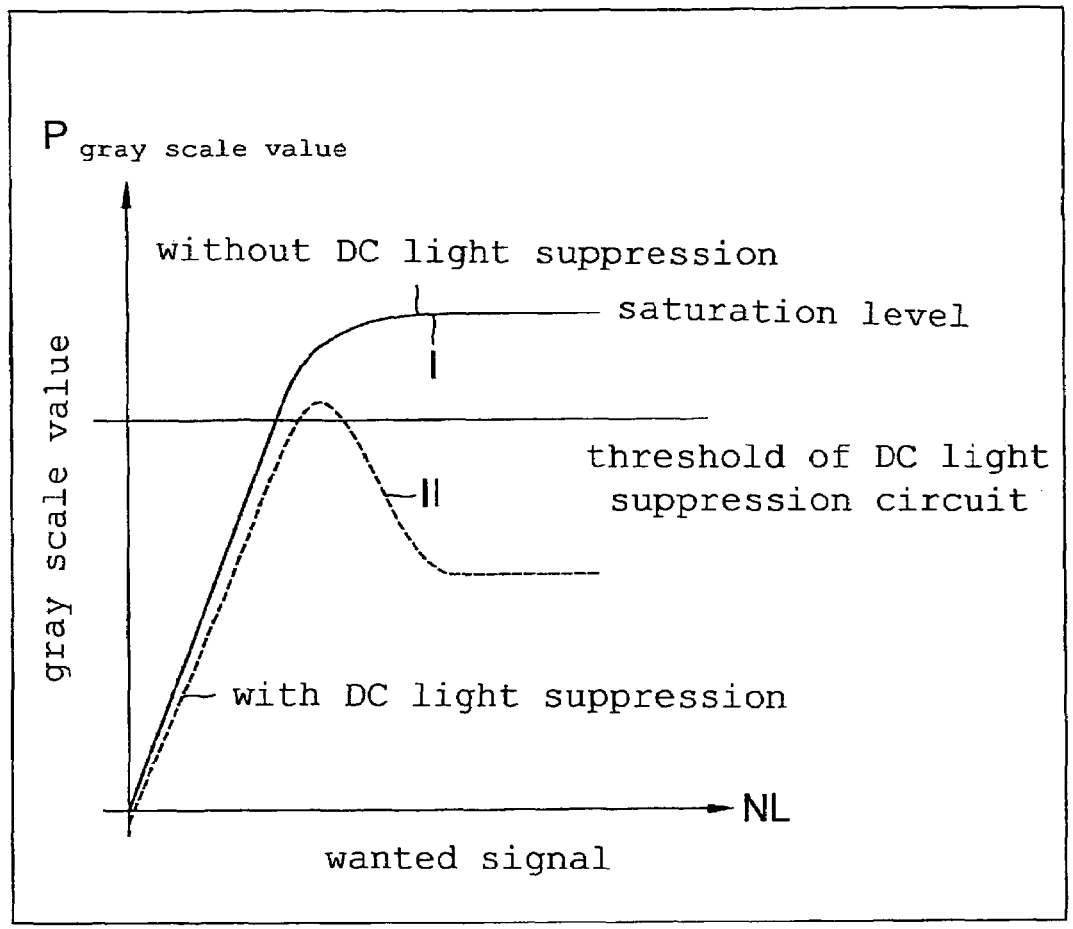
FIG. 4 shows in a schematic view the behavior of the pixel gray scale value by summation in case of an increase of the wanted signal according to the state of art.

As an example FIG. 4 shows in a schematic view the behavior of the pixel gray scale value $P_{Grayscalevalue}$ (pixel gray scale value image) by summation subject to an increase of the wanted signal NL (=active illumination, optical-modulation signal M1) according to the state of art. If here the stray light suppression circuit 28 is deactivated, the pixel gray scale value $P_{Grayscalevalue}$ behaves analogous when increasing the wanted signal NL (see curve I, full line), as is the case with the increase of stray light according to FIG. 3. If one activates the stray light suppression circuit 28, the pixel gray scale value $P_{Grayscalevalue}$ is increased by summation until the preset threshold of the stray light suppression circuit 28 and is later reduced (see curve II, dashed line). If the wanted signal NL is increased in such strong way that a video signal would reach again or would excess the reset potential, the pixel gray scale value $P_{Grayscalevalue}$ is no longer reduced, but takes a stationary state (see FIG. 4). In FIG. 4 it can be seen that the pixel gray scale value $P_{Grayscalevalue}$ shows ambiguities by summation with the activated stray light suppression circuit 28, e.g. the pixel gray scale value $P_{Grayscalevalue}$ is falsified (see curve II).

Figure 5A:
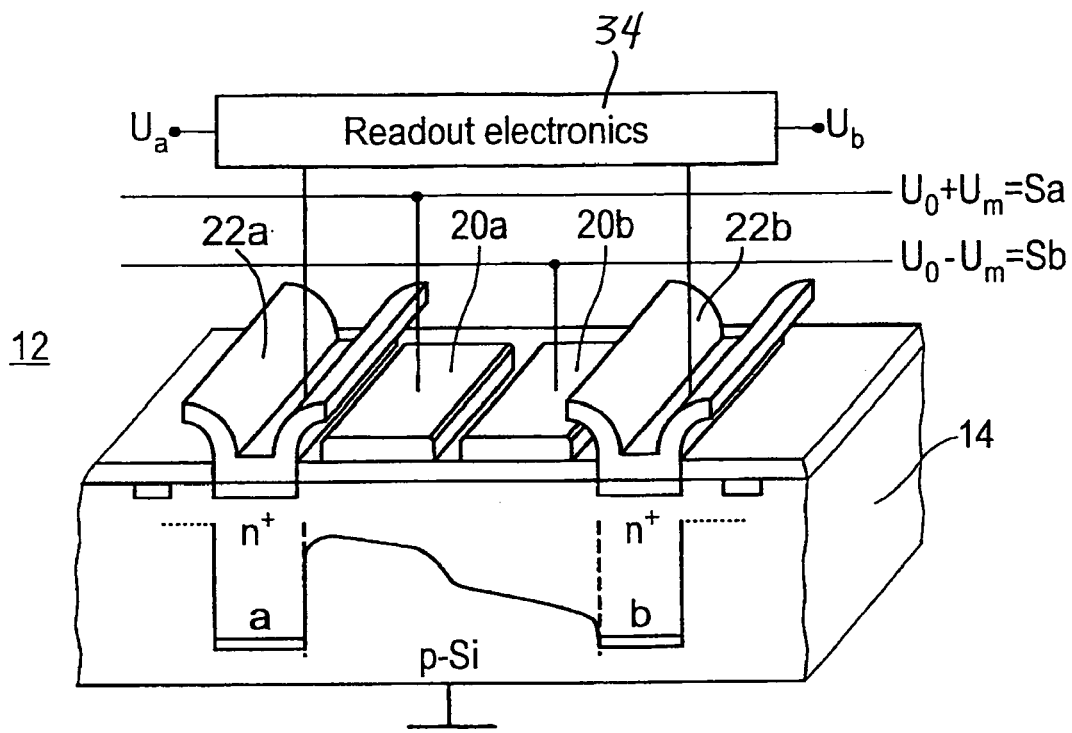
FIG. 5 shows with the aid of schematic views the functional principle of a photonic mixer detector (=Photonic Mixer Device or in short PMD)
Figures 5B, 5C:
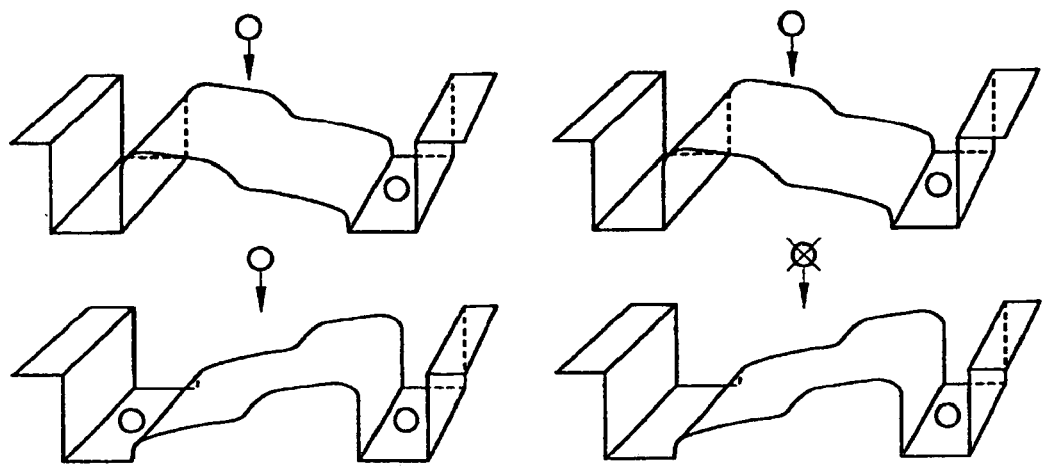

FIGS. 5a to 5c show in schematic views the functional principle of the photonic mixer detector 12 (also called photonic mixer device or in short PMD). FIG. 5a shows a cross-section through the photonic mixer detector 12 embodied as a silicon component. FIGS. 5b and 5c show the potential course of the photo loads at the reception units 20a and 20b, formed as modulation gates, of the pixel element 14—FIG. 5 with stray light SL and FIG. 5c with wanted or useful light as a wanted signal NL.

From FIG. 5b it can be seen that the load carriers produced by the interfering light SL are distributed at equal parts in the potential pots of the modulation gates 20a and 20b. Via readout electronics—the readout units 22a and 22b—the current signals $U_a$ and $U_b$ are selected, which behave directly proportional to the collected load carriers. If the difference of the voltage signals $U_a$ and $U_b$ is formed, it can be seen that only the modulated light portion or the optical modulation signal M1 (=wanted signal NL) is taken into consideration.

In order to obtain a pixel gray scale value image independently and free of background light or stray light SL and interfering signals, by means of the evaluating unit 16 the complex number is determined in exponential form and shown.

$$z = r \cdot e^{j\phi d}$$

The length of the pointer r is the amount |z| of the complex number z. This results in $$|z| = P_{Gray} = \sqrt{(\Delta Re)^2 + (\Delta Im)^2} \quad (14)$$

and simultaneously represents the pixel gray scale value $P_{Gray}$ independently and free of interfering signals and stray light SL and is simultaneously the size of the received wanted signal NL.

For a different view of the pixel gray scale value $P_{Gray}$, e.g. for the case of a poor contrast in the 2D-image, various correction possibilities are embodied. In a preferred form of embodiment a logarithmization of the pixel gray scale value $P_{Gray}$ is provided. Alternatively or additionally, different correction factors K can be taken into consideration, e.g. K=2. A possible form of embodiment for determining the pixel gray scale value $P_{Gray}$, independently of interfering signals SL, which takes into account the logarithmization as well as a correction, is performed as follows:

$$P_{Gray} = \log\left(\sqrt{(\Delta Re)^2 + (\Delta Im)^2}\right) \cdot K \quad (15)$$

with K=a suitable correction factor, which depending on the system is adapted to the conditions accordingly.

Figure 6:
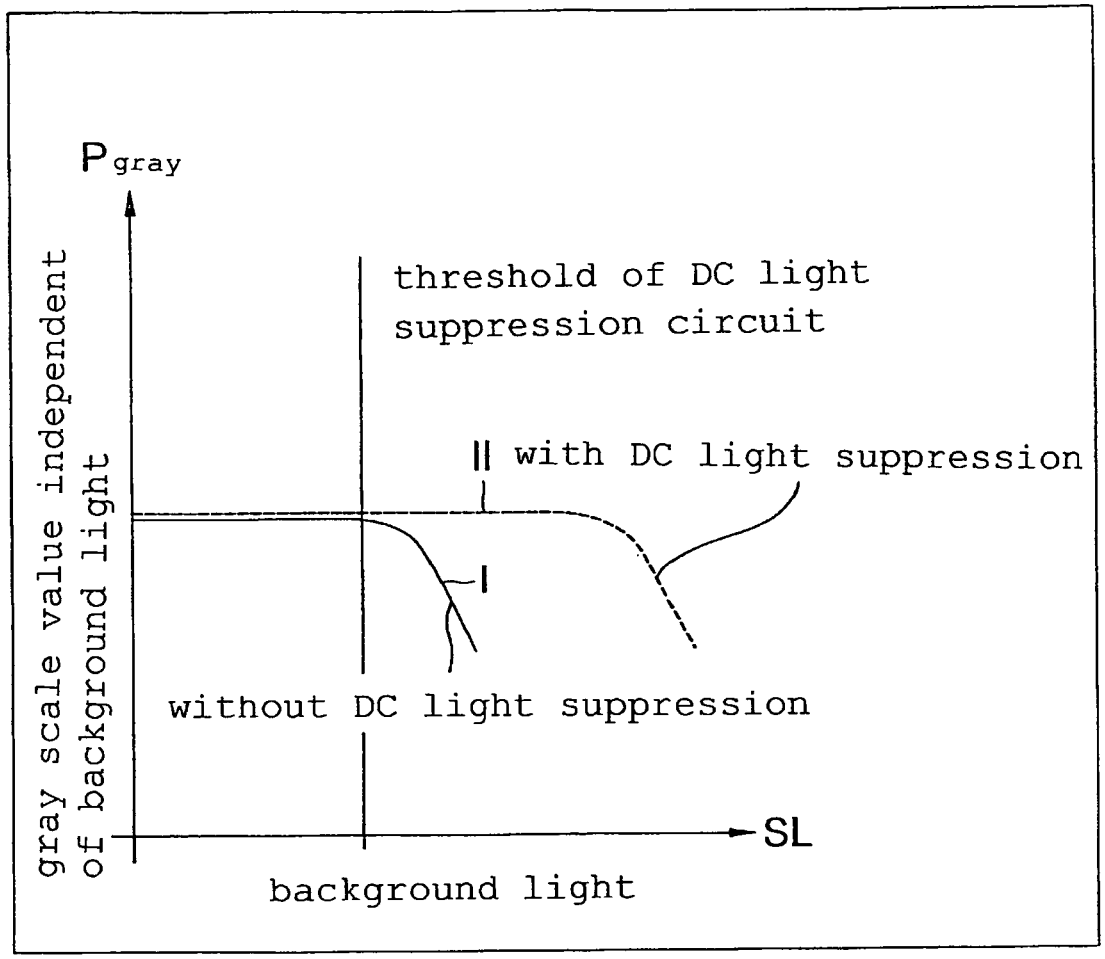
FIG. 6 shows the behavior of a pixel gray scale value independently of the background light when increasing the constant light.

FIG. 6 shows the behavior according to the invention of the pixel gray scale value $P_{Gray}$, independently of interfering stray light SL or background light and interfering signals, subject to an increase of the interfering stray light SL.

With a constantly received wanted signal NL (=optical-modulation signal M1) at the photonic mixer detector 12 a pixel gray scale value $P_{Gray}$, independently of interfering stray light SL, appears. If, for example, the background light or stray light is increased, the pixel gray scale value $P_{Gray}$, independently of stray light, changes only if the saturation level of the video signals is reached (see curve I with deactivated stray light suppression circuit 28). If the stray light suppression circuit is activated, the constant region is extended (see curve II). If the background light or stray light is too high, the pixel gray scale value $P_{Gray}$ changes.

Figure 7:
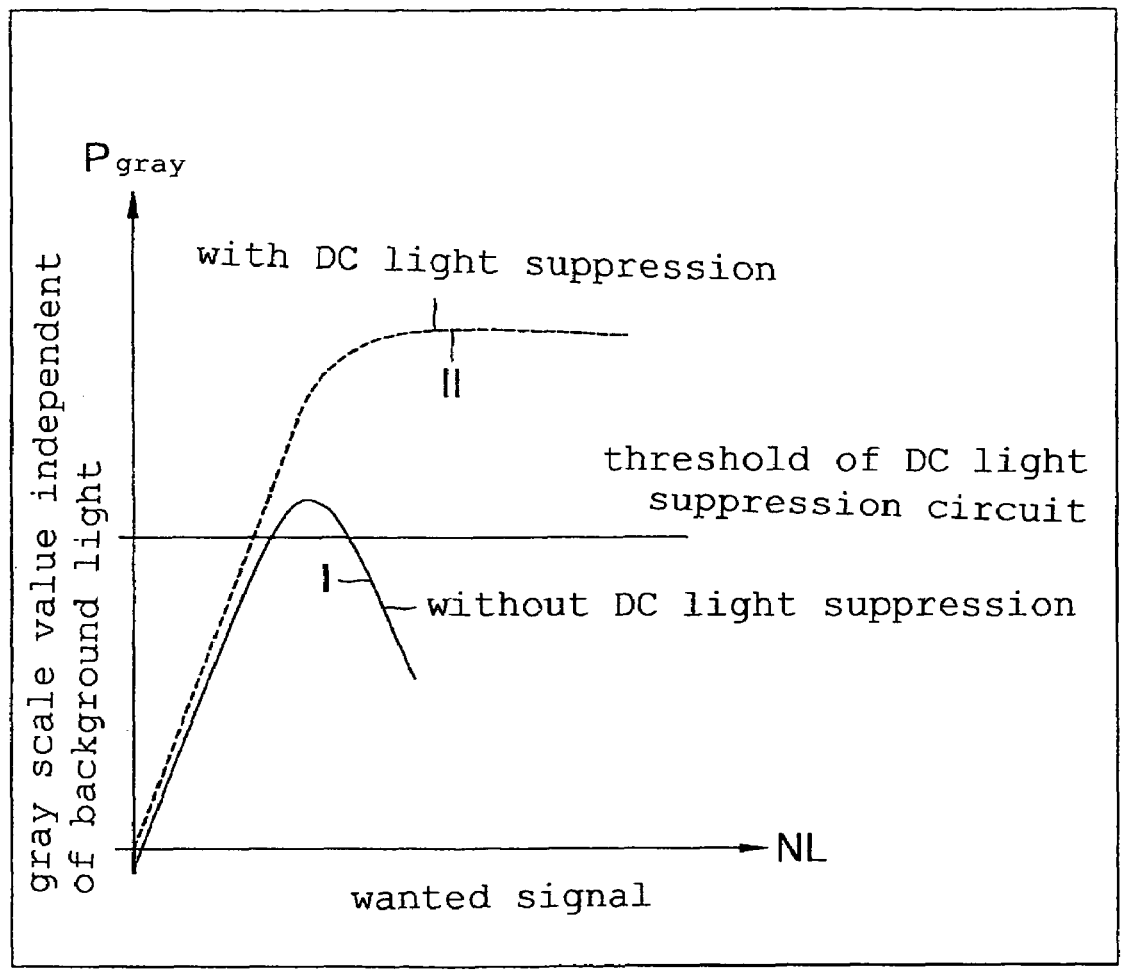
FIG. 7 shows the behavior of a pixel gray scale value independently of the background light when increasing the wanted signal.

FIG. 7 shows the behavior of the interfering stray light SL independently of the pixel gray scale value $P_{Gray}$ subject to the increase of the wanted signal NL (=optical modulation signal M1).

If the stray light suppression circuit 28 is deactivated, the pixel gray scale value $P_{Gray}$, independently of interfering stray light SL and interfering signals, is increased until the saturation limit of the video signals. Thereafter, the pixel gray scale value $P_{Gray}$, independent of interfering stray light SL, e.g. background light, reduces (=curve I). This is not the case with an activated stray light suppression circuit 28 (=curve II). The pixel gray scale value $P_{Gray}$ increases as long as a video signal is equal to or higher than the output potential (reset potential). The pixel gray scale value $P_{Gray}$, independent of interfering signals, now remains constant.

A comparison of the functional course II of the pixel gray scale value $P_{Grayscalevalue}$ according to the state of art in FIG. 4 with the functional course II of the pixel gray scale value $P_{Gray}$ in accordance with the present invention in FIG. 7 shows that recording of the gray scale value image by means of the photonic mixer detector 12 embodied in accordance with the invention with a modified readout unit 16 reaches a higher signal dynamics than is the case with determination of the conventional pixel gray scale value $P_{Grayscalevalue}$ by summation. Futhermore, it can be seen in FIG. 4 that the curve course II of the pixel gray scale value $P_{Grayscalevalue}$ shows ambiguities.

The present invention has been demonstrated with the aid of the above description to best possibly explain the principle of the invention and its practical application, however, the invention can, of course, be realized with an adequate modification in diverse other forms of embodiment. Particularly a modulation gate structure on CMOS-basis is described, however, the application of the invention is conceivable in principle for other photo-sensitive structures that can be modulated such as e.g. on the basis of PIN diodes (PIN).

LIST OF REFERENCE NUMERALS

1 Device for determining a pixel gray scale value image
2 Emitter, e.g. light source, HF-emitter
4 Signal generator
6 Transfer path
8 Delay
10 Damping
12 Reception unit, e.g. photonic mixer detector or antenna
14 Pixel element
16 Readout unit
18 Phase shifter
20a, 20b Modulation gates
22a, 22b Readout units
26 Stray light suppression circuit
30 Maximum value detector
32 Current sources
A Output signal
D Difference formation
G Threshold value
Ia, Ib Current signals
K Correction factor
k Phase measurement
L Light
M1 First modulation signal, e.g. optical signal, microwave signal
M2 Second modulation signal, e.g. electical signal
NL Wanted or useful signal
$P_E$ Pixel distance value
$P_{Gray}$ pixel gray scale value acc. to invention
$P_{Gray\ scale\ value}$ pixel gray scale value acc. to state of art
R Distance value
S Electrical signal
Sa Electrical signal supplied at the emitting end
Sb Electrical signal supplied at the receiving end
SL Interfering stray light or background light
Ua, Ub voltage signals
$\Delta U$ Voltage differential signal
$\psi k$ Phase steps
$\phi_D$ Phase offset
24a Integration capacitance
24b Integration capacitance
34 Readout electronics

What is claimed is:

1. A method for determining a pixel gray scale value image, particularly for a multi-dimensional image system, in which a first modulation signal (M1) which is emitted at the emitting end and is reflected on an object that is to be recorded is correlated with a second modulation signal (M2) and is recorded at the receiving end based on at least two correlation signals (Ua, Ub or Ia, Ib) that are proportional to the respective received first modulation signal (M1), wherein one of the modulation signals (M1, M2) is phase shifted in at least four phase steps ($\psi k$) at the emitting or receiving end and wherein for each phase step ($\psi k$) based on the correlation signals (Ua, Ub or Ia, Ib,) a differential signal (D) is determined and based on said differential signal (D) a pixel gray scale value ($P_{Gray}$) is determined independently of interfering signals, wherein the pixel gray scale value ($P_{Gray}$) is determined based on the complex function of the differential signal (D) as per $$|z| = P_{Gray} = \sqrt{(\Delta Re)^2 + (\Delta Im)^2}.$$

2. A method according to claim 1, wherein one of the modulation signals (M1, M2) is shifted at the emitting end or receiving end in several phase steps ($\psi k$) by a phase of 45° or 90°.

3. A method according to claim 1, wherein a pixel gray scale value ($P_{Gray}$) as well as a pixel distance value ($P_E$) is determined on the basis of the differential signal (D).

4. A method according to claim 1, wherein the pixel gray scale value ($P_{Gray}$) is determined subject to the wavelength.

5. A method according to claim 1, wherein the pixel gray scale value ($P_{Gray}$) is logarithmized.

6. A method according to claim 1, wherein the pixel gray scale value ($P_{Gray}$) is corrected based on a correction factor (K).

7. A method according to claim 1, wherein a voltage differential signal ($\Delta U$) or a current differential signal ($\Delta I$) is determined as the differential signal (D).

8. A method according to claim 1, wherein a conventional pixel gray scale value ($P_{Grayscalevalue}$) is determined subject to one individual of the correlation signals (Ua, Ub, Ia or Ib).

9. A device (1) for determining a pixel gray scale value image, particularly for a multi-dimensional image system, comprising an emitter (2) for emitting a first modulation signal (M1) and at least one reception unit (12) for receiving the first modulation signal (M1) reflected on an object that is to be recorded as well as a signal generator (4) and a phase shifter (18) for phase modulation at the emitting or receiving end with a second modulation signal (M2) in phase steps ($\psi k$), wherein one readout unit (22a, 22b) each is associated to the reception unit (12) for determining at least two correlation signals (Ua, Ub or Ia, Ib) that are proportional to the respective received first modulation signal (M1), which readout units (22a, 22b) are connected with an evaluating unit (16) for determining a differential signal (D) formed of the correlation signals (Ua, Ub or Ia, Ib) and for determining a pixel gray scale value ($P_{Gray}$), independently and particularly free of interfering signals, based on the detected differential signal (D), a) wherein for the readout units (22*a*, 22*b*) a stray light suppression circuit (28) and for each readout unit (22*a*, 22*b*) an identical controllable current source (32) is provided,
b) the voltage signals (Ua, Ub) of both readout units (22*a*, 22*b*) are supplied to the stray light suppression circuit (28) and a threshold value (G) is provided,
c) and both current sources (32) are triggered with an output signal (A) of the stray light suppression circuit (28), if one of the two voltage signals (Ua, Ub) exceeds the threshold value (G), the output signal (A) is then proportional to the higher of the two voltage signals (Ua, Ub).

10. A device according to claim 9, wherein the reception units (12) are embodied as antennas and the emitter (2) as an HF-emitter.

* * * * *